(12) United States Patent
Gardner et al.

(10) Patent No.: US 8,154,052 B2
(45) Date of Patent: Apr. 10, 2012

(54) LIGHT EMITTING DEVICE GROWN ON WAVELENGTH CONVERTING SUBSTRATE

(75) Inventors: Nathan F. Gardner, Sunnyvale, CA (US); Aurelien J. F. David, San Francisco, CA (US); Oleg B. Shchekin, San Francisco, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 161 days.

(21) Appl. No.: 12/775,201

(22) Filed: May 6, 2010

(65) Prior Publication Data

US 2011/0272720 A1    Nov. 10, 2011

(51) Int. Cl.
*H01L 31/072* (2012.01)
*H01L 31/109* (2006.01)
*H01L 31/0238* (2006.01)
*H01L 31/0336* (2006.01)

(52) U.S. Cl. ... 257/201; 257/88; 257/104; 257/E21.352; 257/E21.366; 257/E33.061

(58) Field of Classification Search ............... 257/40, 257/79, 98, 99, 104, 189, 200, 201, E21.352, 257/E33.061, E21.366
See application file for complete search history.

(56) References Cited

U.S. PATENT DOCUMENTS

| | | | |
|---|---|---|---|
| 5,374,564 A | 12/1994 | Bruel | |
| 6,310,364 B1 | 10/2001 | Uemura | |
| 6,822,991 B2 | 11/2004 | Collins, III et al. | |
| 6,956,247 B1 | 10/2005 | Stockman | |
| 7,012,279 B2 | 3/2006 | Wierer Jr. et al. | |
| 7,279,718 B2 | 10/2007 | Krames et al. | |
| 7,294,862 B2 | 11/2007 | Wierer, Jr. et al. | |
| 7,341,878 B2 | 3/2008 | Krames et al. | |
| 7,361,938 B2 | 4/2008 | Mueller et al. | |
| 7,442,964 B2 | 10/2008 | Wierer, Jr. et al. | |
| 7,442,965 B2 | 10/2008 | Wierer, Jr. et al. | |
| 7,514,721 B2 * | 4/2009 | Krames et al. | 257/98 |
| 7,521,862 B2 | 4/2009 | Mueller et al. | |
| 7,642,108 B2 | 1/2010 | Krames et al. | |
| 2005/0026394 A1 | 2/2005 | Letertre et al. | |
| 2006/0202105 A1 | 9/2006 | Krames et al. | |
| 2007/0072324 A1 | 3/2007 | Krames et al. | |
| 2008/0149956 A1 | 6/2008 | Mueller-Mach et al. | |
| 2011/0175112 A1 * | 7/2011 | David et al. | 257/79 |

FOREIGN PATENT DOCUMENTS

WO    2007063460 A1    6/2007

* cited by examiner

*Primary Examiner* — David Nhu

(57) ABSTRACT

In some embodiments of the invention, a device includes a substrate and a semiconductor structure. The substrate includes a wavelength converting element comprising a wavelength converting material disposed in a transparent material, a seed layer comprising a material on which III-nitride material will nucleate, and a bonding layer disposed between the wavelength converting element and the seed layer. The semiconductor structure includes a III-nitride light emitting layer disposed between an n-type region and a p-type region, and is grown on the seed layer.

19 Claims, 3 Drawing Sheets

REFLECTANCE (%) vs. WAVELENGTH (nm)

REFLECTANCE (%) vs. WAVELENGTH (nm)

LIGHT EMITTING DEVICE GROWN ON WAVELENGTH CONVERTING SUBSTRATE

BACKGROUND

1. Field of Invention

The present invention relates to a semiconductor light emitting device grown on a wavelength converting composite substrate.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates an LED described in more detail in U.S. Pat. No. 7,514,721, which is incorporated herein by reference. "A luminescent ceramic 52 is bonded to a nucleation structure 58 by a bond 56 at the interface between the nucleation structure 58 and the luminescent ceramic, either directly by wafer bonding or through an intermediate bonding layer (not shown). If a bonding layer is used, the bonding layer preferably has an index of refraction between the indices of refraction of the III-nitride layer to which the bonding layer is applied and the luminescent ceramic, though bonding layers with lower indices of refraction may be used. Epitaxial layers including a light emitting region 14 disposed between an n-type region 10 and a p-type region 12 are then grown on the nucleation structure." N- and p-contacts 18 and 20 are formed on the n- and p-type regions 10 and 12.

SUMMARY

In some embodiments of the invention, a device includes a substrate and a semiconductor structure. The substrate includes a wavelength converting element comprising a wavelength converting material disposed in a transparent material, a seed layer comprising a material on which III-nitride material will nucleate, and a bonding layer disposed between the wavelength converting element and the seed layer. The semiconductor structure includes a III-nitride light emitting layer disposed between an n-type region and a p-type region, and is grown on the seed layer.

In some embodiments of the invention, a semiconductor structure is grown on a substrate that includes a wavelength converting element, a seed layer comprising a material on which III-nitride material will nucleate, and a dichroic filter disposed between the wavelength converting element and the seed layer.

In some embodiments of the invention, a device includes a substrate, a semiconductor structure, and a scattering structure. The substrate includes a wavelength converting element, a seed layer comprising a material on which III-nitride material will nucleate, and a bonding layer disposed between the wavelength converting element and the seed layer. The semiconductor structure is grown on the seed layer and includes a III-nitride light emitting layer disposed between an n-type region and a p-type region. The scattering structure is configured to scatter light emitted by at least one of the III-nitride light emitting layer and the wavelength converting element.

DETAILED DESCRIPTION

In embodiments of the invention, a III-nitride light emitting device is grown on a wavelength converting composite substrate including a seed layer bonded to a wavelength converting element.

Though in the examples below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, or Si-based materials may be used.

Figure 1:
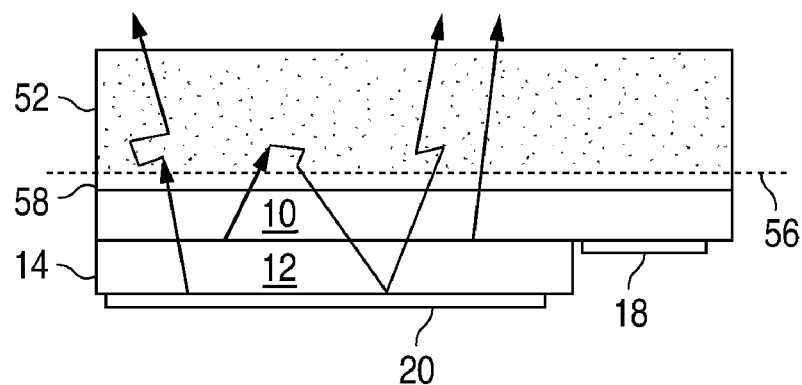
FIG. 1 illustrates a prior art III-nitride LED grown on a nucleation structure attached to a luminescent ceramic.
Figure 2:
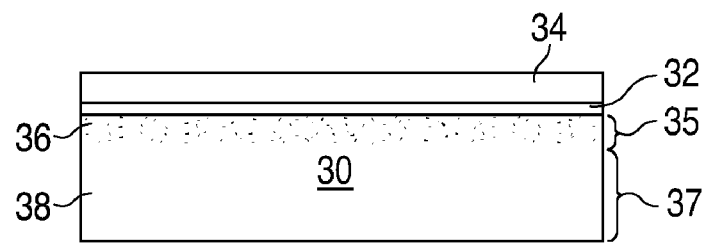
FIG. 2 illustrates a composite substrate including a seed layer bonded to a wavelength converting element.

FIG. 2 illustrates a wavelength converting substrate according to embodiments of the invention. A wavelength converting element 30 is bonded to a seed layer 34.

Seed layer 34 may be directly bonded to wavelength converting element 30, or an optional bonding layer 32 such as, for example, $SiO_x$, $SiO_2$, borophosphosilicate glass (BPSG), $SiN_x$, $Si_3N_4$, $HfO_2$, mixtures thereof, metals such as Mo, Ti, TiN, other alloys, and other semiconductors or dielectrics, may be disposed between seed layer 34 and wavelength converting element 30.

All of wavelength converting element 30, optional bonding layer 32, and seed layer 34 are selected to withstand the conditions required to grow a III-nitride light emitting device including, for example, five hours at temperatures of at least 800° C. in an $H_2$ ambient. In some embodiments, wavelength converting element 30 is selected such that the luminescent properties of the wavelength converting element, including, for example, quantum efficiency, maintenance of quantum efficiency over time, emission spectrum, absorption spectrum, and maintenance of quantum efficiency over temperature, degrade less than 20%, or more preferably less than 10%, when exposed a temperature greater than 800° C. for at least two hours in an $N_2$ ambient.

In some embodiments, wavelength converting element 30, optional bonding layer 32, and seed layer 34 are selected to have coefficients of thermal expansion (CTE) that are reasonably well-matched to III-nitride material. In some embodiments, the CTE of wavelength converting element 30 is between 5 ppm and 9 ppm per degree Kelvin.

In some embodiments, wavelength converting element 30, optional bonding layer 32, and seed layer 34 are selected to have particular indices of refraction. For example, the indices of refraction may be selected to efficiently extract light from the III-nitride layers into air.

In some embodiments, wavelength converting element 30 is a luminescent ceramic formed by, for example, sintering a powder phosphor, as described in more detail in U.S. Pat. No. 7,341,878, U.S. Pat. No. 7,361,938, and U.S. Pat. No. 7,521,862, all of which are incorporated herein by reference.

In the embodiment illustrated in FIG. 2, wavelength converting element 30 is a wavelength converting material 36 disposed in a transparent material 38. Wavelength converting material 36 may be, for example, one or more powder phosphors, dyes, semiconductor materials, or quantum dots. Non-wavelength-converting materials such as $TiO_x$ particles may be included in the transparent material or in a luminescent ceramic, for example to cause light scattering or to improve the off-state white appearance of the device. Transparent material 38 may be, for example, glass, borophosphosilicate glass (BPSG), quartz, or $SiO_2$.

An LED combined with a wavelength converting substrate including one or more wavelength converting materials may be used to create white light or monochromatic light of other colors. All or only a portion of the light emitted by the LED may be converted by the wavelength converting substrate. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device.

Multiple wavelength converting materials may be mixed in a single wavelength converting element, formed as discrete layers in a single wavelength converting element, or formed as mixed or discrete layers in multiple wavelength converting elements that may be bonded or glued together. In some embodiments, the wavelength converting element includes two luminescent ceramic plates laminated together, a luminescent ceramic plate attached to a wavelength converting material disposed in a transparent material, a mixture of wavelength converting materials disposed in a transparent material, or multiple wavelength converting materials disposed in different regions of transparent material.

Figure 9:
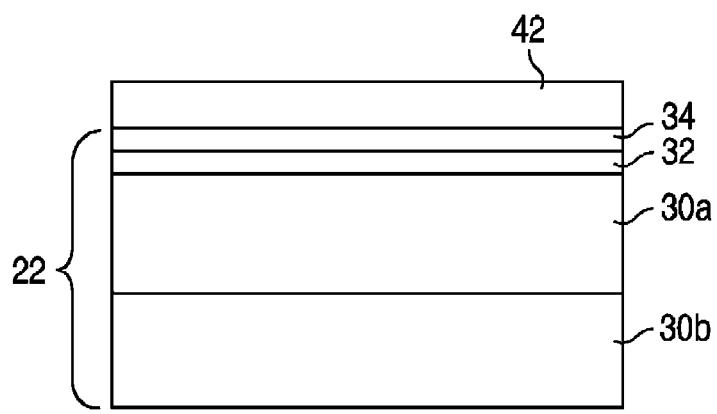
FIG. 9 illustrates a semiconductor structure grown on a composite substrate including two wavelength converting elements.

FIG. 9 illustrates a substrate 22 with multiple wavelength converting elements 30a and 30b. A seed layer 34 is attached to wavelength converting element 30a through bonding layer 32. In some embodiments, wavelength converting element 30a, which is closer than wavelength converting element 30b to the semiconductor structure 42 grown on seed layer 34, is a red-emitting wavelength converting element. Wavelength converting element 30b, which is farther from semiconductor structure 42, is a yellow- or green-emitting wavelength converting element. One or more reflective contacts may be formed on the semiconductor structure such that light is extracted from the device through wavelength converting elements 30a and 30b. Wavelength converting elements 30a and 30b may be connected by an adhesive before or after forming substrate 22, and before or after growing and/or processing semiconductor structure 42.

The amount of wavelength converting material in the wavelength converting element is determined by the desired spectrum of the device. In some embodiments, in the wavelength converting element illustrated in FIG. 2, the wavelength converting material 36 is confined to only a part of the thickness of the wavelength converting element. In the wavelength converting element 30 of FIG. 2, the wavelength converting material is disposed in a region 35 of the wavelength converting element closest to the seed layer. A region 37 of the wavelength converting element further from the seed layer does not include any wavelength converting material. The two regions may be reversed such that the region without wavelength converting material is disposed between the seed layer 34 and the wavelength converting material, or the region with wavelength converting material may be sandwiched between two regions without wavelength converting material. Similarly, in a device where the wavelength converting element is a luminescent ceramic, only part of the thickness of the ceramic slab may include activating dopant, as described in more detail in U.S. 2008/0149956, titled "Multi-Grain Luminescent Ceramics for Light Emitting Devices," and incorporated herein by reference. Only the portion of the luminescent ceramic with activating dopant is wavelength converting.

Wavelength converting element 30 must be thick enough to mechanically support the seed layer and III-nitride layers grown on the seed layer. For example, the wavelength converting element may be between 20 and 500 microns thick in some embodiments, between 50 and 200 microns thick in some embodiments, and between 80 and 120 microns thick in some embodiments. A luminescent ceramic wavelength converting element may be well suited for a device where all of the light emitted by the semiconductor device is converted. A luminescent ceramic uniformly doped with activating dopant that is thick enough to mechanically support the seed layer and III-nitride layers may convert substantially all of the light emitted by the semiconductor device. Examples of such a device include a blue- or UV-emitting semiconductor device grown on a substrate including a green- or amber-emitting luminescent ceramic wavelength converting element. The device emits light that appears green or amber, depending on the luminescent ceramic used.

The wavelength converting element may be shaped or textured, for example by roughening or by forming a pattern such as a photonic crystal, for example to improve light extraction. The wavelength converting element may be shaped or textured before or after forming the composite substrate, before or after growing a III-nitride structure, and before or after processing the III-nitride structure into a device, for example by etching a mesa and forming n- and p-contacts. The wavelength converting element may be thinned, for example by laser ablation, after the semiconductor device is grown and tested, in order to reach a desired color point of the combined light emitted by the semiconductor device and the wavelength converting element.

In some embodiments, wavelength converting element 30 has a rough surface. Bonding layer 32 may be formed on wavelength converting element 30, then planarized, for example by chemical-mechanical polishing.

Seed layer 34 may be any suitable material on which III-nitride material will nucleate. Seed layer 34 is generally a single crystal material such as sapphire, SiC, ScMgAlO$_4$, GaN, InGaN, AlGaN, AlN, InN, AlInGaN, or another III-nitride or III-V material.

The substrate illustrated in FIG. 2 may be formed as follows. Typically the substrate is formed on a wafer-scale, with multiple substrates formed at the same time in a wafer. The wafer is then diced into individual substrates. Besides the specific materials and methods described below, the materials and methods described in U.S. 2007/0072324 may also be used.

First, a wafer of wavelength converting elements 30 is formed. A luminescent ceramic wafer may be formed by, for example, sintering a powder phosphor as described in U.S. Pat. No. 7,361,938. A wafer of wavelength converting material disposed in a transparent material may be formed by the methods described in U.S. 2005/0274967, which is incorporated herein by reference. For example, a well homogenized mixture of phosphor, e.g., approximately 10 to 20 vol % of YAG,n, and a powdered glass such as BPSG or quartz is inserted into a suitable crucible. The crucible is inserted into, e.g., a preheated electrical furnace or other type of furnace such as a high frequency furnace or microwave furnace. After the transparent material mixture melts, the melt is homogenized in the furnace. After approximately ten to thirty minutes of melting and homogenization, the melt is poured onto a plate, e.g., a stainless steel plate. The melt is pressed on the sheet to form a sheet of phosphor embedded in glass or quartz.

The phosphor material or other wavelength converting material that is embedded in the sheet may be selected based on the desired wavelengths of the secondary light. By way of example, one suitable phosphor that may be used with a blue light emitting device in order to produce white light is Y$_3$Al$_5$O$_{12}$:Ce (YAG:Ce). If desired other phosphors may be used, including, but are not limited to: Gd$_3$Ga$_5$O$_{12}$:Ce, (Lu,Y)$_3$Al$_5$O$_{12}$:Ce, SrS:Eu, SrGa$_2$S$_4$:Eu, (Sr,Ca,Ba)(Al,Ga)$_2$S$_4$:Eu, (Ca,Sr)S:Eu, (Ca,Sr)S:Eu,Mn, (Ca,Sr)S:Ce, (Sr,Ba,Ca)$_2$Si$_5$N$_8$:Eu, (Ba,Sr,Ca)$_2$SiO$_4$:Eu, and (Ca,Sr,Ba)Si$_2$O$_2$N$_2$:Eu.

The poured melt of glass and phosphor may be permitted to harden in a flat sheet. Alternatively, the sheet may be molded with desired features. For example, the sheet may be molded to include a number of lens elements.

In another embodiment, the sheet is produced using a sol-gel process. The desired phosphor or phosphors are dispersed within the sol-gel glass during formation. A sol-gel glass process is described in U.S. Pat. No. 6,642,618, which is incorporated herein by reference.

Bonding layer 32 is then formed over the wafer of wavelength converting elements 30. Bonding layer 32 may be, for example, SiO$_2$, borophosphosilicate glass (BPSG) or other commercial glasses deposited by, for example, evaporation, sputtering, and sedimentation.

The material that will become the seed layer is then prepared. For a III-nitride seed layer, the seed layer material is conventionally grown on a donor substrate, which may be, for example, sapphire, Si, or SiC. The seed layer material may be grown over a sacrificial semiconductor layer, which is implanted with an implant species such as H$^+$ that facilitates later separation of the donor substrate from the seed layer. For a non-III-nitride seed layer such as sapphire, ScMgAlO$_4$, or SiC, a sapphire, ScMgAlO$_4$, or SiC wafer may be implanted at a depth corresponding to the desired thickness of the seed layer. In some embodiments, the sacrificial layer is GaN and the seed layer is InGaN with an InN composition greater than zero and up to 12%.

A III-nitride seed layer may be grown with the group III face, also referred to as the gallium face, up. The device layers are preferably grown on the gallium face of the seed layer. Accordingly, a gallium face III-nitride seed layer may be bonded first to a temporary substrate, which exposes the group V or nitrogen face, then to the wavelength converting element 30. For a non-III-nitride seed layer or a nitrogen face III-nitride seed layer, the seed layer may be directly bonded to wavelength converting element 30, as described below. An optional bonding layer and a compliant layer are formed on the temporary substrate. The seed layer grown on the donor substrate is bonded to the temporary substrate through the compliant layer. In some embodiments, the optional bonding layer is one or more oxides, nitrides, carbides, or fluorides of silicon, aluminum, boron, phosphorus, zinc, gallium, germanium, indium, tin, antimony, lead, bismuth, titanium, tungsten, magnesium, calcium, potassium, nickel, yttrium, zirconium, hafnium, neodymium, and tantalum. In some embodiments, the compliant layer is SiO$_2$, borophosphosilicate glass (BPSG), or other commercial glasses deposited by, for example, evaporation, sputtering, and sedimentation.

The seed layer is separated from the donor substrate by activating the implanted species, for example by heating, to split the sacrificial layer. Implanting a sacrificial layer and separating a seed layer from a donor substrate by activating the implant species is described in more detail in U.S. Patent Application Publication 2005/0026394 and U.S. Pat. No. 5,374,564, which are incorporated herein by reference. Alternatively, the donor substrate may be removed by laser melting of the sacrificial layer.

Any remaining sacrificial layer is removed from the seed layer, and trenches are etched in the seed layer. The structure is treated to cause the regions of strained seed layer material to expand and relax, for example by heating the compliant layer such that the regions of seed layer material glide over the compliant layer. In some embodiments, trenches are first etched in the seed layer, the structure is treated to cause the regions of strained seed layer material to expand and relax (e.g. by heating), then any remaining sacrificial layer is removed from the seed layer.

The seed layer is then bonded to the wavelength converting element 30, for example by applying heat and/or pressure between the two structures. The temporary substrate is removed, for example by etching away the bonding layer bonding the temporary substrate to the seed layer. The compliant layer is also removed, exposing the gallium face of the seed layer, as illustrated in the completed composite substrate shown in FIG. 2.

Figure 3:
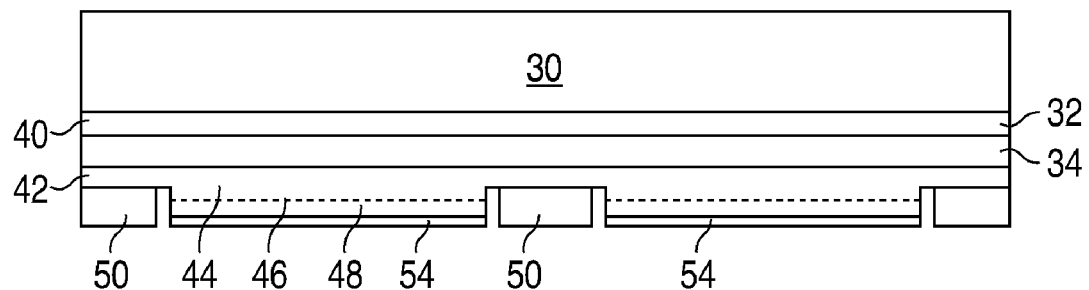
FIG. 3 illustrates a device grown on a composite substrate including a wavelength converting element.
Figure 8:
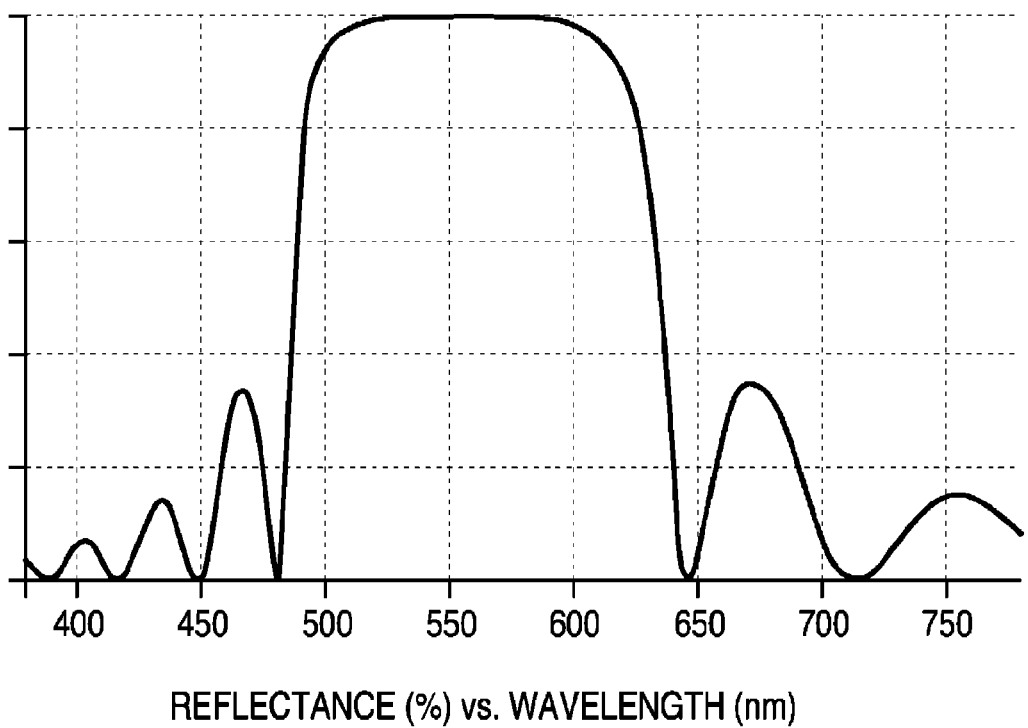
FIG. 8 is a plot of reflectance as a function of wavelength for one example of a dichroic filter that may be disposed between a seed layer and a wavelength converting element in a substrate.

FIG. 3 illustrates a device according to embodiments of the invention. In the device of FIG. 3, a semiconductor structure 42 is grown over a wavelength converting substrate including a wavelength converting element 30 attached to a seed layer 34. In the device illustrated in FIG. 3, bonding layer 32 between seed layer 34 and wavelength converting element 30 is a dichroic filter 40. For example, bonding layer 32 may be a stack of dielectric layers that act as a dichroic filter. Dichroic filter 40 may be configured, for example, to transmit light of a wavelength emitted by the active region of the semiconductor structure and reflect light of a wavelength emitted by the wavelength converting element 30, to prevent wavelength converted light that is back-scattered toward the semiconductor device from being absorbed by the semiconductor device. For example, the dichroic filter may comprise 10 pairs of the layers HfO$_2$ and SiO$_2$ with thicknesses of 66.75 and 94.5 nm, respectively. Such a filter will reflect more than 95% of light emitted by the wavelength converting element 30 with a wavelength greater than 500 nm and less than 620 nm, as illustrated in FIG. 8, which is a plot of reflectance as a function of wavelength for a dichroic filter with 10 pairs of $HfO_2$ and $SiO_2$, as described above. In some embodiments, an additional bonding layer, such as glass, is disposed between the dichroic filter and the seed layer, between the dichroic filter and the host, or both.

The semiconductor structure 42 includes a light emitting or active region sandwiched between n- and p-type regions. The composition of the layer of semiconductor structure 42 adjacent to seed layer 34 may be chosen for its lattice constant or other properties, and/or for its ability to nucleate on the material of seed layer 34. N-type region 44 is typically grown first and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. Light emitting or active region 46 is grown over the n-type region. Examples of suitable light emitting regions include a single thick or thin light emitting layer, or a multiple quantum well light emitting region including multiple thin or thick light emitting layers separated by barrier layers. P-type region 48 is grown over the light emitting region. Like the n-type region, the p-type region may include multiple layers of different composition, thickness, and dopant concentration, including layers that are not intentionally doped, or n-type layers.

In the device illustrated in FIG. 3, portions of the p-type region and active region are etched away to expose an n-type layer for metallization, such that the p-contact 54 and n-contact 50 are on the same side of the device. The contacts are generally reflective and the device is generally mounted such that light is extracted through the wavelength converting substrate, though the contacts may be limited in extent or made transparent, and the device may be mounted such that light is extracted through the surface on which the contacts are formed. In the device illustrated in FIG. 3, multiple n-type contact regions are interposed by p-type contact regions. In a vertical injection LED, an n-contact is formed on one side of the semiconductor structure, and a p-contact is formed on the other side of the semiconductor structure. For example, the p-contact may be formed on the p-type region, and a portion of the wavelength converting substrate may be removed and an n-contact formed on a surface of the n-type region exposed by removing a portion of the substrate. Electrical contact to the n-contact may be made with a wire or a metal bridge. The p-contact is often directly bonded to a contact pad on the mount.

In some embodiments, a structure is included in the device to increase light extraction from the device, for example by increasing scattering. FIGS. 4-7 illustrate scattering structures disposed between the wavelength converting element 30 and the p-contact 54. The scattering structures illustrated in FIGS. 4-7 may be included in a flip chip device with reflective contacts, as illustrated in FIG. 3, in a vertical device, or in a device where light is extracted through contacts formed on the same side of the device.

Figure 4:
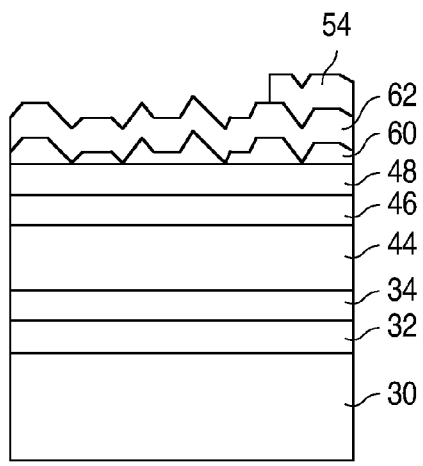
FIG. 4 illustrates part of a device including a rough p-type region and a transparent conductive metal oxide.

In the structure illustrated in FIG. 4, a rough p-type layer 60 is grown after p-type region 48. For example, after p-type region 48 is grown, the growth conditions may be switched to conditions that favor forming a rough surface such as a higher ambient pressure, for example greater than 400 mbar. A portion of the rough p-type layer 60, p-type region 48, and light emitting region 46 are etched away to expose a portion of n-type region 44 on which the re-contact is formed. A transparent, conductive oxide 62 such as indium tin oxide, copper aluminum oxide, zinc oxide, or ruthenium oxide is formed over at least a part of the remaining rough p-type surface 60. The transparent conductive oxide layer may have a thickness of 10 nm to 10 µm, more preferably in the range of 100 nm to 1 µm. One or more p-contacts 54 is formed over transparent conductive oxide 62. The p-type metal formed over the conductive oxide may be limited in extent and the device mounted such that light is extracted through the transparent conductive oxide, or if the p-type metal covers a large fractional area of the device, the device may be mounted as a flip chip such that light is extracted through wavelength converting element 30. The difference in index of refraction between rough p-type layer 60 and transparent conductive oxide 62 scatters light.

In some embodiments, a transparent material such as $SiO_2$ or other oxide is disposed on the rough p-type surface, then planarized, for example by chemical-mechanical polishing. Openings are formed in the transparent material, exposing the p-type region. A reflective metal p-contact is deposited over the transparent material and in the holes, such that it makes electrical contact to the p-type region. The transparent material layer may improve the reflectivity of the p-contact, which may improve the efficiency of the device. An example of a contact including a transparent material with openings is illustrated in FIG. 5 below.

Figure 5:
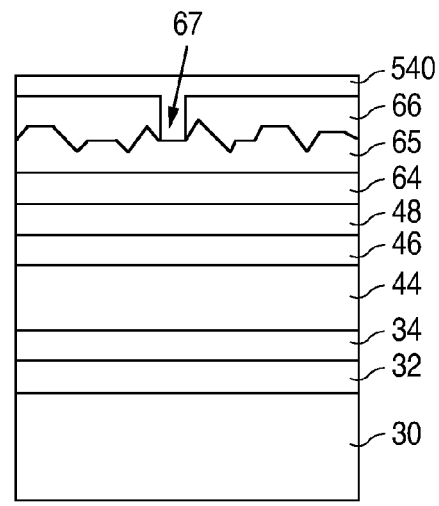
FIG. 5 illustrates part of a device including a tunnel junction and a rough n-type region.

In the structure illustrated in FIG. 5, the n-type region 44, light emitting region 46, and p-type region 48 are grown as described above. A tunnel junction 64 is grown over p-type region 48. Tunnel junctions for III-nitride LEDs are described in more detail in U.S. Pat. No. 6,822,991 and U.S. Pat. No. 6,878,975, which are incorporated herein by reference. Tunnel junction 64 includes a highly doped p-type layer, also referred to as a p++ layer, and a highly doped n-type layer, also referred to as an n++ layer. The p++ layer may be, for example, InGaN or GaN, doped with an acceptor such as Mg or Zn to a concentration of about $10^{18}$ $cm^{-3}$ to about $5\times10^{20}$ $cm^{-3}$. In some embodiments, the p++ layer is doped to a concentration of about $2\times10^{19}$ $cm^{-3}$ to about $2\times10^{20}$ $cm^{-3}$. The n++ layer may be, for example, InGaN or GaN, doped with an acceptor such as Si or Ge to a concentration of about $10^{18}$ $cm^{-3}$ to about $5\times10^{20}$ $cm^{-3}$. In some embodiments, an intermediate semiconductor layer such as AlN may be sandwiched between the n++ and p++ layers.

Tunnel junction 64 is usually very thin; for example, tunnel junction 64 may have a total thickness ranging from about 2 nm to about 100 nm. Each of the p++ layer and n++ layer may have a thickness ranging from about 1 nm to about 50 nm and the intermediate layer, if included, may have a thickness ranging from about 1 nm to 50 nm. In some embodiments, each of the p++ layer and n++ layer may have a thickness ranging from about 25 nm to about 35 nm. The p++ layer and n++ layer may not necessarily be the same thickness.

In one embodiment, the p++ layer is 15 nm of Mg-doped InGaN and the n++ layer is 30 nm of Si-doped GaN. The p++ layer and n++ layer may have a graded dopant concentration. For example, a portion of the p++ layer adjacent to the underlying p-type region 48 may have a dopant concentration that is graded from the dopant concentration of the underlying p-type region to the desired dopant concentration in the p++ layer. Similarly, the n++ layer may have a dopant concentration that is graded from a maximum adjacent to the p++ layer to a minimum adjacent to an n-type region grown over the tunnel junction.

Tunnel junction 64 is fabricated to be thin enough and doped enough such that tunnel junction 64 displays low series voltage drop when conducting current in reverse-biased mode. In some embodiments, the voltage drop across tunnel junction 64 is about 0.1V to about 1V.

A rough n-type layer 65 is disposed over the n++ region of tunnel junction 64. N-type layer 65 may be grown under conditions that cause a rough surface, or may be grown planar then roughened, for example by photoelectrochemical etching. A transparent material 66 such as $SiO_2$ or another oxide is formed over n-type layer 65. One or more openings 67 down to n-type layer 65 are formed in transparent material 66. A contact 540 is formed over transparent material 66 and within openings 67. As an alternative to transparent material 66 and openings 67, a transparent conductive oxide may be formed between contact 540 and n-type layer 65, as illustrated above in FIG. 4.

An n-contact is formed on a portion of n-type region 44 exposed by, for example, removing or not forming a portion of light emitting region 46, p-type region 48, tunnel junction 64, n-type layer 65, and transparent material 66, or by removing a portion of wavelength converting element 30, bonding layer 32, and seed layer 34. The device is forward biased by supplying current to the n-contact and contact 540, causing tunnel junction 64 to break down.

In some embodiments, scattering is caused by a photonic crystal or lattice embedded in or formed on the surface of the III-nitride structure. In such a structure, changes in the optical index of refraction are provided in a periodic manner, at a spacing that is near the wavelength of light emitted by the light emitting region in the material. The parameters of the periodic index change, such as the period and amplitude, may be selected to increase the amount of light extracted into a desired emission pattern. For example, the size and spacing of a lattice or photonic crystal may be selected to maximize the amount of light extracted in a direction normal to a top surface of the semiconductor structure. Selecting the parameters for and forming a photonic crystal are described in more detail in U.S. Pat. Nos. 7,642,108, 7,442,965, 7,442,964, 7,294,862, 7,279,718, 7,012,279, and 6,956,247, all of which are incorporated herein by reference.

Figure 6:
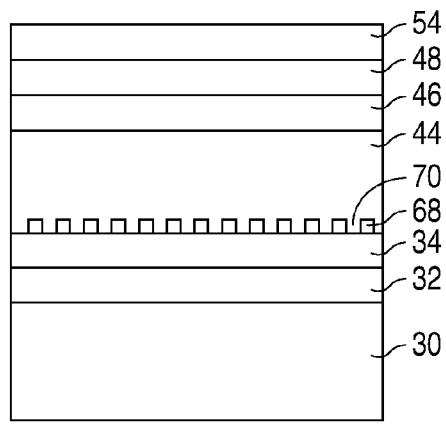
FIG. 6 illustrates part of a device including a patterned non-III-nitride layer disposed on a composite substrate including a wavelength converting element.
Figure 7:
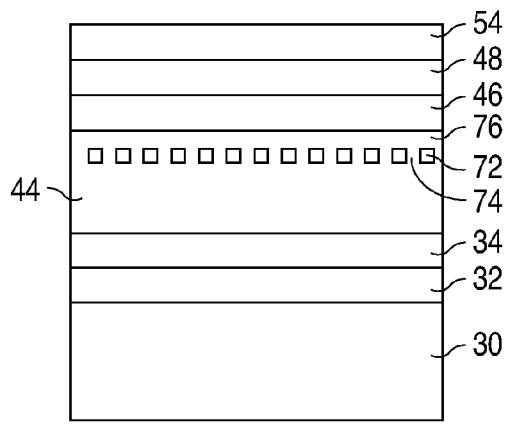
FIG. 7 illustrates part of a device including a patterned non-III-nitride layer disposed within the n-type region.

FIGS. 6 and 7 illustrate devices including photonic crystals or other lattices. In the device illustrated in FIG. 6, a substrate including a wavelength converting element 30, and bonding layer 32, and a seed layer 34 is formed as described above. A transparent material 68 such as $SiO_2$ is deposited on seed layer 34, then patterned by, for example, nanoimprint lithography to form a photonic crystal or other variation in index of refraction. For example, transparent material 68 may be patterned to form a lattice of openings 70, or a lattice of posts of transparent material 68. The semiconductor structure is then grown over the transparent material 68. The semiconductor structure may be grown such that the n-type region 44 immediately coalesces over transparent material 68, or such that air pockets form between or over regions of transparent material 68, then the semiconductor material coalesces into a substantially planar n-type region 44. The light emitting and p-type regions are then grown as described above, and a device is formed as described above.

In the device illustrated in FIG. 7, n-type region 44 is grown over a composite substrate including a wavelength converting element 30, as described above. A transparent material 72 is disposed over n-type region 44, then patterned, as described above in reference to FIG. 6. An additional n-type layer 76 is grown over transparent material 72. N-type layer 76 may be grown under conditions that fill in the openings 74 between areas of transparent material 72 with n-type material that coalesces over the transparent material 72, or under conditions that cause air pockets to form between or above the regions of transparent material 72, then the semiconductor material coalesces into a substantially planar n-type region 76. Light emitting region 46 and p-type region 48 are grown over n-type region 76, as described above. The re-contact may be formed on either n-type region 44 or n-type region 76.

In some embodiments, a nanoporous GaN layer may be disposed in an n-type layer in the device, for example in a first n-type GaN layer deposited over the seed layer. In some embodiments, nanoporous III-nitride material may replace the regions of transparent material 72 in the device illustrated in FIG. 7. The amount of scattering is determined by the thickness and porosity of the porous layer. The porous layer generally has a thickness between 0.5 and 40 microns. The porous layer may have a porosity between 5% and 80% and often has a porosity between 20% and 40%. The porosity is limited on the lower end by the ability of the porous layer to scatter light and on the upper end by the resistivity and mechanical stability of the porous layer. Suitable porosity may be related to the thickness of the porous region. In order to provide the same amount of scattering, a thicker porous region may be less porous than a thinner porous region. The light rays reflected and scattered by a porous layer will have a Lambertian radiation pattern with maximum intensity directed perpendicular to the surface.

A III-nitride layer may be made porous as follows: a platinum wire connected to the layer to be made porous serves as the anode. The other end of the platinum wire serves as the cathode. The wafer and platinum wire are immersed in a 2M NaOH solution. A direct current is applied through the wire and wafer, for example at a density between 10 and 20 $mA/cm^2$. Optional UV-illumination is supplied by a 250 W mercury lamp. An appropriate porosity may require 10 to 60 minutes of processing, after which the lamp and the current source are switched off. Alternatively, platinum may be applied directly over the surface of the wafer, or different solutions such as KOH, fluoride acids, or $CH_3OH:HF:H_2O_2$ are used in a photo-electro-chemically driven process.

The density and size of the porosity may be controlled by varying the concentration of the solution. The etching almost exclusively occurs at the tips of the electrolyte-semiconductor interface (ends of the pores); therefore, by altering the solution during etching, a multilayer porosity may be created. To facilitate growth, a small pore layer at the surface of the template may be produced with a low molarity solution (0.5% KOH). Then, to increase the compliance of the template and thereby promote relaxation, a large pore layer beneath the surface may be produced with a high molarity solution (2% KOH). The small pore layer may be 30-150 nm in thickness and the large pore layer maybe 100-4000 nm in thickness, limited by the stability of the porous material and the thickness of the nonporous material beneath the porous region. If electrically conductive GaN is grown on an electrically conductive SiC substrate, porous GaN on porous SiC maybe created by continuing the etching process into the growth substrate, which may permit thinner III-nitride growth.

In the porous region, air voids are formed in the III-nitride material. The voids may be on the order of tens to hundreds of nm in size, for example between 10 and 500 nm in size. Nearest neighbor voids may be spaced on the order of tens to hundreds of nm apart, for example between 10 and 500 nm apart. The porous region may be, for example, between 0.02 and 3 μm thick. The percent porosity, defined as the volume of voids as a percent of the total volume of the porous region, can vary from 20-80%, and is often greater than 50%. The conductivity type and dopant concentration in the semiconductor material may influence the characteristics of the porous layer, for example by influencing the size and spacing of the pores formed. In some embodiments, the porous region is formed from an n-type GaN layer that is doped with a dopant concentration between zero (not intentionally doped) and $10^{19}$ cm$^{-3}$.

Devices formed on wavelength converting substrates according to embodiments of the invention may be combined with other conventional wavelength converting materials, such as pre-formed ceramic phosphor layers that are glued or bonded to the LED, or a powder phosphor disposed in an organic encapsulant that is stenciled, screen printed, sprayed, sedimented, evaporated, sputtered, or otherwise dispensed over the LED.

The device illustrated in FIG. 3 may be mechanically self-supporting without requiring a mount or support substrate or lens. Accordingly, the device illustrated in FIG. 3 may be connected by a user to a suitable device such as a printed circuit board by a simple connection such as solder. Since the device is mechanically self-supporting, a more robust connection that supports the III-nitride structure, such as gold-gold interconnects or a supporting underfill material, are not required. In some embodiments, wettable metals which define the solderable regions on the n- and p-contacts are formed on the n- and p-contacts of the device illustrated in FIG. 3.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
a substrate comprising:
    a wavelength converting element comprising a wavelength converting material disposed in a transparent material;
    a seed layer comprising a material on which III-nitride material nucleates; and
    a bonding layer disposed between the wavelength converting element and the seed layer; and
a semiconductor structure grown on the seed layer, the semiconductor structure comprising a III-nitride light emitting layer disposed between an n-type region and a p-type region.

2. The device of claim 1 wherein a luminescent property of the wavelength converting element is reduced less than 20% when the wavelength converting element is exposed to a temperature greater than 800° C. for at least two hours.

3. The device of claim 1 wherein the wavelength converting material is phosphor and the transparent material is one of glass, quartz, and SiO$_2$.

4. The device of claim 1 wherein:
the wavelength converting material is disposed in a first portion of the transparent material; and
a second portion of the transparent material is without wavelength converting material.

5. The device of claim 1 wherein the wavelength converting element comprises a wavelength converting material disposed in a transparent material, bonded to a ceramic phosphor.

6. A device comprising:
a substrate comprising:
a wavelength converting element;
    a seed layer comprising a material on which III-nitride material nucleates; and
    a dichroic filter disposed between the wavelength converting element and the seed layer; and
a semiconductor structure grown on the seed layer, the semiconductor structure comprising a III-nitride light emitting layer disposed between an n-type region and a p-type region.

7. The device of claim 6 wherein the dichroic filter is configured to reflect light of a wavelength emitted by the wavelength converting element.

8. The device of claim 6 wherein the wavelength converting element comprises a ceramic phosphor.

9. The device of claim 6 wherein the wavelength converting element comprises a wavelength converting material disposed in a transparent material.

10. The device of claim 6 further comprising a bonding layer disposed between the dichroic filter and the seed layer.

11. A device comprising:
a substrate comprising:
    a wavelength converting element;
    a seed layer comprising a material on which III-nitride material nucleates; and
    a bonding layer disposed between the wavelength converting element and the seed layer;
a semiconductor structure grown on the seed layer, the semiconductor structure comprising a III-nitride light emitting layer disposed between an n-type region and a p-type region; and
a scattering structure configured to scatter light emitted by at least one of the III-nitride light emitting layer and the wavelength converting element.

12. The device of claim 11 wherein the scattering structure comprises a III-nitride layer with a rough surface.

13. The device of claim 12 further comprising a transparent conductive layer disposed between the rough surface and a metal contact.

14. The device of claim 12 further comprising:
a transparent insulating layer disposed between the rough surface and a metal contact, wherein the transparent insulating layer has a planar top surface; and
at least one opening formed in the transparent insulating layer, wherein conductive material is disposed in the opening.

15. The device of claim 11 wherein the scattering structure comprises a periodic variation in index of refraction, wherein the variation is in a direction parallel to a major surface of the light emitting layer.

16. The device of claim 15 wherein the periodic variation in index of refraction is disposed within the n-type region.

17. The device of claim 15 wherein the periodic variation in index of refraction is disposed between the n-type region and the seed layer.

18. The device of claim 11 wherein the wavelength converting element comprises a phosphor capable of emitting red light.

19. The device of claim 18 wherein:
the wavelength converting element is a first wavelength converting element, the device further comprising a second wavelength converting element comprising a phosphor capable of emitting green or yellow light; and
the first wavelength converting element is disposed between the semiconductor structure and the second wavelength converting element.

* * * * *